United States Patent
Liu et al.

(10) Patent No.: US 9,136,168 B2
(45) Date of Patent: Sep. 15, 2015

(54) CONDUCTIVE LINE PATTERNING

(71) Applicant: Taiwan Semiconductor Manufacturing Company, Ltd., Hsin-Chu (TW)

(72) Inventors: Ru-Gun Liu, Zhubei (TW); Tung-Heng Hsieh, Zhudong Town (TW); Tsung-Chieh Tsai, Chu-Bei (TW); Juing-Yi Wu, Hsinchu (TW); Liang-Yao Lee, Taoyuan (TW); Jyh-Kang Ting, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/930,859

(22) Filed: Jun. 28, 2013

(65) Prior Publication Data

US 2015/0001734 A1 Jan. 1, 2015

(51) Int. Cl.
*H01L 21/768* (2006.01)
*H01L 23/528* (2006.01)
*H01L 23/522* (2006.01)
*G06F 17/50* (2006.01)

(52) U.S. Cl.
CPC ...... *H01L 21/76892* (2013.01); *G06F 17/5077* (2013.01); *H01L 23/522* (2013.01)

(58) Field of Classification Search
CPC ... H01L 21/768; H01L 23/528; H01L 23/522; G06F 17/30
USPC .......... 257/773, 774; 438/587, 669, 689, 618
See application file for complete search history.

(56) References Cited

U.S. PATENT DOCUMENTS

| | | | | |
|---|---|---|---|---|
| 4,319,118 | A * | 3/1982 | Chason | 219/118 |
| 2008/0080249 | A1* | 4/2008 | Chen et al. | 365/185.18 |
| 2009/0114903 | A1* | 5/2009 | Kalburge | 257/24 |
| 2010/0159685 | A1* | 6/2010 | Chuang et al. | 438/587 |
| 2011/0037175 | A1* | 2/2011 | Bangsaruntip et al. | 257/773 |
| 2011/0042750 | A1 | 2/2011 | Chuang et al. | |

* cited by examiner

*Primary Examiner* — Sheng Zhu
(74) *Attorney, Agent, or Firm* — Slater & Matsil, L.L.P.

(57) ABSTRACT

A method includes placing two conductive lines in a layout. Two cut lines are placed over at least a part of the two conductive lines in the layout. The cut lines designate cut sections of the two conductive lines and the cut lines are spaced from each other within a fabrication process limit. The two cut lines are connected in the layout. The two conductive lines are patterned over a substrate in a physical integrated circuit using the two connected parallel cut lines. The two conductive lines are electrically conductive.

20 Claims, 2 Drawing Sheets

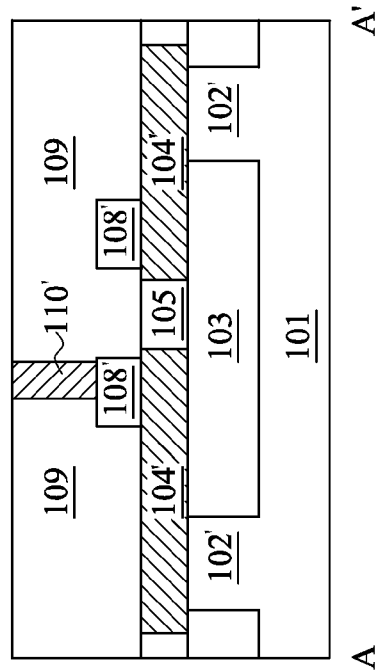
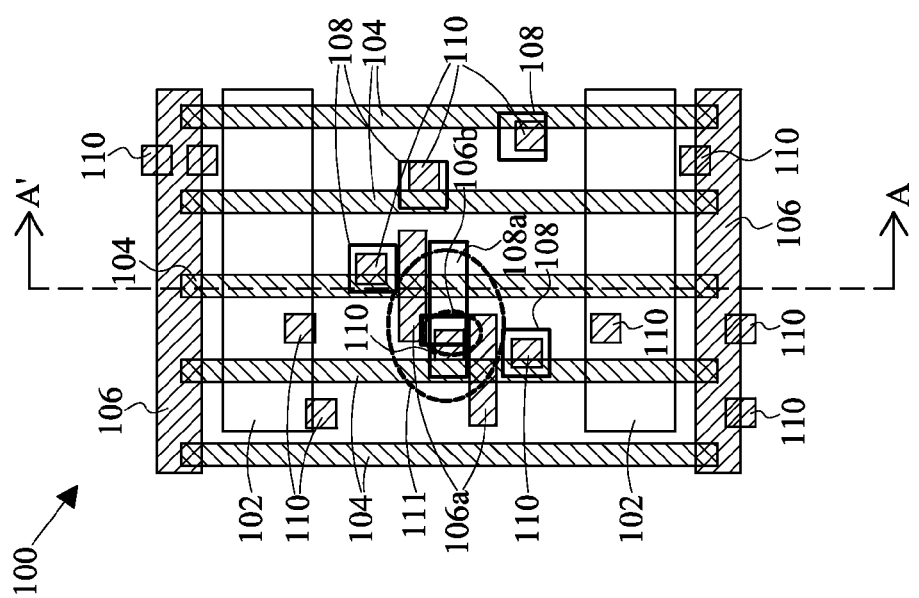
Fig. 1A
Fig. 1B

CONDUCTIVE LINE PATTERNING

TECHNICAL FIELD

The present disclosure relates generally to an integrated circuit and more particularly to conductive line patterning.

BACKGROUND

For integrated circuit layouts, there are size limitations such as minimum pitch or spacing. In some layouts, a conductive line such as a polysilicon line is cut with a cut poly (CPO) pattern, but some layout methods have a photolithography process limit as the integrated circuit size shrinks. Methods to overcome the shortcomings in the state of the art are desirable.

BRIEF DESCRIPTION OF THE DRAWINGS

Reference is now made to the following descriptions taken in conjunction with the accompanying drawings, in which:

FIG. 1A is a schematic diagram of an exemplary integrated circuit layout of a conductive line structure according to some embodiments;

FIG. 1B is a cross section view of an exemplary physical integrated circuit that is fabricated according to the exemplary integrated circuit layout of the conductive line structure in FIG. 1A according to some embodiments.

DETAILED DESCRIPTION

Figure 2A:
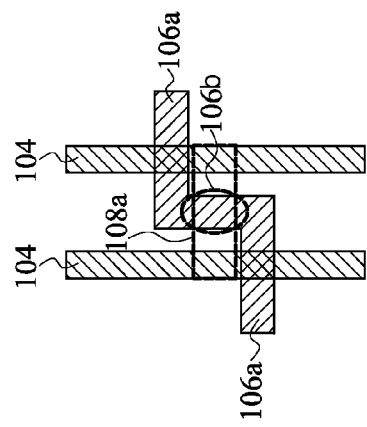
FIGS. 2A-2D are intermediate steps of generating the exemplary integrated circuit layout in FIG. 1A and fabricating the exemplary integrated circuit in FIG. 1B.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary integrated circuit layout 100 of a conductive line structure according to some embodiments. The integrated circuit layout 100 includes active areas 102 where devices such as transistors are formed, modeled conductive lines 104 such as polysilicon, cut lines 106 such as cut polysilicon (CPO) pattern, other conductive line 108 in another layer such as a metal layer pattern, and vias 110. The integrated circuit layout 100 can be generated by a computer based system and stored in a computer readable medium.

The modeled conductive lines 104 in the layout 100 represent electrically conductive lines to be formed in a physical integrated circuit over a substrate. The modeled conductive lines 104 can comprise polysilicon or other electrically conductive material such as metal in a metal layer. The cut lines 106 represent cut sections or patterning area where the modeled conductive lines 104 are removed for electrical connections/disconnections according to the integrated circuit design.

In an exemplary layout area 111, there are two modeled conductive lines 104 and two cut lines 106a that cover a portion of the two modeled conductive lines 104. The two cut lines 106a are within a fabrication process limit from each other. For example, the minimum pitch for cut lines 106a in the layout 100 is 0.08 μm and there is a lithography process limit of 0.13 μm for cut lines 106a in some embodiments. The two cut lines 106a are spaced from each other within the process limit of 0.13 μm.

To help with the fabrication process, the two cut lines 106a are connected by a connecting cut line 106b in the layout 100. The connected cut lines 106a and 106b are etched out together in the fabrication process as described below with respect to FIGS. 2C-2D.

FIG. 1B is a cross section view of an exemplary physical integrated circuit that is fabricated according to the exemplary integrated circuit layout 100 of the conductive line structure in FIG. 1A according to some embodiments. The cross section view is along the cut line A-A'.

The substrate 101 includes the active area 102' and comprises silicon or any other suitable material. A shallow trench isolation (STI) area 103 is located between the active areas 102' for electrical isolation and comprises silicon dioxide or any other suitable material. The physical conductive lines 104' are shown with a cut section 105 filled with dielectric material. The cut section 105 is fabricated from the cut line 106a shown in the layout 100 that indicates that the modeled conductive line 104 in FIG. 1A is to be removed in the cut line 106a area during the fabrication process. The physical conductive lines 104' can be polysilicon lines in some embodiments. In other embodiments, the physical conductive lines 104' can be in a metal layer.

Another conductive line 108a in a different layer such as a metal layer is shown. The connecting conductive line 108a in the metal layer can electrically connect the two physical conductive lines 104' in the polysilicon layer. The via 110' is shown for electrical connection to the conductive line 108' (e.g., metal layer). In some embodiments, there is at least one via 110' disposed over the connecting conductive line 108', wherein the at least one via 110' electrically is connected to the connecting conductive line 108'. The dielectric layer 109 is used for insulation and comprises silicon dioxide, silicon nitride, or any other suitable material.

FIGS. 2A-2D are intermediate steps of generating the exemplary integrated circuit layout 100 in FIG. 1A and fabricating the exemplary integrated circuit in FIG. 1B. In FIG. 2A, two modeled conductive lines 104 and two cut lines 106a are shown in an integrated circuit layout similar to the layout 100 in FIG. 1A.

In some embodiments, the two modeled conductive lines 104 are parallel with each other, the two cut lines 106a are parallel with each other, and the two modeled conductive lines 104 and two cut lines 106a intersect at right angles. The modeled conductive lines 104 can be polysilicon lines or metal lines, for example.

The cut lines 106a are spaced from each other within the fabrication process limit. For example, a lithography process limit for cut lines 106a in some embodiments is 0.13 μm, and the minimum pitch for cut lines 106a in the layout is 0.08 μm. The two cut lines 106a are spaced from each other within the process limit of 0.13 μm.

Figure 2B:
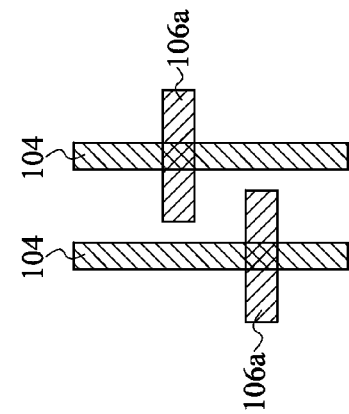

In FIG. 2B, the two cut lines 106a are connected by a connecting cut line 106b in the layout to help the fabrication process. In some embodiments, a connecting conductive line is placed between the two conductive lines 104 in the layout at a location between the two cut lines 106a in a different layer (such as another metal layer) from the two modeled conductive lines 104.

Figure 2C:
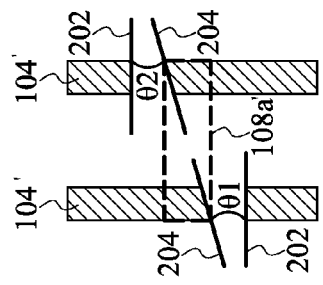

In FIG. 2C, the merged cut section 201 is based on the cut lines 106a and 106b in the integrated circuit fabrication. The merged cut section 201 is etched out together from the physical conductive lines 104' using a photolithography process. Note that the actual cut out section is not shaped with straight lines and right angles, as is the layout pattern. This, as is known in the art, is due to imprecision introduced by the manufacturing process, such as the lithography and etching processes.

Figure 2D:
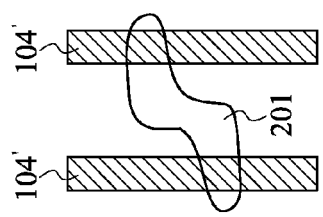

In FIG. 2D, the two physical conductive lines 104' are shown with cut angle lines 202 and 204 after the etching process in FIG. 2C. The cut angle line 202 is flat at a right angle with respect to the conductive line 104' in some embodiments. In this case, the cut angle of the cut angle line 202 is 0 degree. In comparison, the cut angle θ1 and θ2 of the cut angle line 204 is at different angles from the cut angle line 202. The cut angle θ1 and θ2 are in the range from 10 degree to 45 degree in some embodiments.

The two physical conductive lines 104' can be electrically connected using a connecting conductive line 108a' fabricated in a different layer in subsequent processes in some embodiments.

The technique in FIGS. 2A-2D can be applied, for example, to gate patterning for high density devices with a restricted layout rule. The physical conductive lines 104' can be polysilicon gate lines and the connecting conductive line 108' can be a metal line in a metal layer. In other embodiments, the physical conductive lines 104' can be metal lines in a metal layer, and the connecting conductive line 108' can be a metal line in another metal layer.

Using the above method, conductive line cut pattern such as CPO pattern can be implemented even when the cut pattern has a pitch that is less than the lithography process pitch limit. For example, a CPO pattern pitch of 0.080 μm can be used, which is less than a fabrication process limit of 0.13 μm.

According to some embodiments, a method includes placing two modeled conductive lines in a layout. Two parallel cut lines are placed over at least a part of the two modeled conductive lines in the layout. The cut lines designate cut sections of the two conductive lines and the cut lines are spaced from each other within a fabrication process limit. The two cut lines are connected in the layout. Two physical conductive lines are patterned over a substrate in a physical integrated circuit using the two connected parallel cut lines.

According to some embodiments, a conductive line structure includes a substrate and two physical conductive lines formed over the substrate. Each of the two physical conductive lines has a cut section. The cut section has a first cut angle and a second cut angle that is different from the first cut angle.

According to some embodiments, a computer readable medium contains an integrated circuit layout. The integrated circuit layout includes two modeled conductive lines and two parallel cut lines disposed over at least a part of the two modeled conductive lines. The two cut lines are spaced from each other within a fabrication process limit. The cut lines designate cut sections of the two modeled conductive lines. A connecting cut line connects the two parallel cut lines.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of manufacturing a device, comprising:
   placing two modeled conductive lines in a layout;
   placing two cut lines over at least a part of the two modeled conductive lines in the layout, wherein the cut lines designate cut sections of the two modeled conductive lines and the cut lines are spaced from each other less than a minimum spacing requirement for a pre-determined photolithography processing node;
   connecting the two cut lines in the layout; and
   patterning two physical conductive lines disposed over a substrate in a physical integrated circuit using the two connected cut lines.

2. The method of claim 1, further comprising forming the two physical conductive lines over the substrate.

3. The method of claim 1, further comprising placing a connecting conductive line between the two modeled conductive lines in the layout at a location between the two cut lines in a different layer from the two modeled conductive lines.

4. The method of claim 3, further comprising forming a physical connecting conductive line over the substrate in the physical integrated circuit between the two physical conductive lines at a different layer from the two physical conductive lines.

5. The method of claim 3, further comprising forming at least one via over the physical connecting conductive line in the physical integrated circuit, wherein the at least one via is electrically connected to the physical connecting conductive line.

6. The method of claim 1, wherein patterning the two physical conductive lines comprises etching a region corresponding to the two connected cut lines, on the two physical conductive lines over the substrate.

7. The method of claim 1, wherein each of the two patterned physical conductive lines has a first cut angle and a second cut angle that is different from the first cut angle.

8. The method of claim 7, wherein the first cut angle is 0 degrees from a right angle line with respect to the two conductive lines.

9. The method of claim 7, wherein the second cut angle ranges from 10 degrees to 45 degrees from a right angle line with respect to the two conductive lines.

10. The method of claim 1, wherein the two physical conductive lines are polysilicon lines.

11. The method of claim 1, wherein the two physical conductive lines are metal lines.

12. A method of manufacturing a device comprising:
modelling in a layout a first conductive line and a second conductive line parallel to the first conductive line;
modelling in the layout a first cut line intersecting the first conductive line and a second cut line intersecting the second conductive line, wherein the first and second cut lines are spaced from each other less than a minimum spacing requirement for a pre-determined photolithography processing node;
modelling in the layout a connecting line connecting the first and second cut lines;
forming a first physical conductive and a second physical conductive line in an integrated circuit; and
patterning the first physical conductive line into a first separate line and a second separate line and patterning the second physical conductive line into a third separate line and a fourth separate line, using the first and second cut lines and the connecting line as patterns.

13. The method of claim 12, wherein the step of patterning the first physical conductive line into a first separate line and a second separate line results in the first separate line having an end portion that forms a right angle to a longitudinal axis of the first physical conductive line and results in the second separate line having an end portion that forms an acute angle to the longitudinal axis of the first physical conductive line.

14. The method of claim 13, wherein the step of patterning the second physical conductive line into a third separate line and a fourth separate line results in the third separate line having an end portion that forms a right angle to a longitudinal axis of the second physical conductive line and results in the fourth separate line having an end portion that forms a second acute angle to the longitudinal axis of the second physical conductive line.

15. The method of claim 14, wherein the second acute angle is equal to the acute angle.

16. The method of claim 12, wherein the step of patterning the first physical conductive line into a first separate line and a second separate line includes a lithography process and an etching process.

17. The method of claim 12, further comprising forming an upper layer metal feature electrically connecting the first separate line to one of the second, the third, and the fourth lines.

18. A method of manufacturing a device comprising:
forming a first conductive line over a semiconductor substrate;
forming a second conductive line over the semiconductor substrate; and
patterning the first conductive line and the second conductive line using an etch pattern that is formed by a first cut line pattern intersecting the first conductive line, a second cut line pattern intersecting the second conductive line, and a connecting pattern connecting the first cut line pattern and the second cut line pattern, wherein the first cut line pattern and the second cut line pattern are spaced from each other less than a minimum spacing for a pre-determined photolithography processing node.

19. The method of claim 18, wherein the step of patterning the first conductive line and the second conductive line forms a cut line separating the first conductive line into two separate lines, the cut line forming a right angle with a first one of the two separate lines and forming an obtuse angle with a second one of the two separate lines.

20. The method of claim 18, wherein the first and second conductive lines are polysilicon lines.

\* \* \* \* \*